United States Patent
Maier et al.

(10) Patent No.: US 10,296,038 B2
(45) Date of Patent: May 21, 2019

(54) REMOTE CONTROL

(71) Applicant: fm marketing gmbh, Neumarkt am Wallersee (AT)

(72) Inventors: Ferdinand Maier, Neumarkt am Wallersee (AT); Thomas Fischer, Bayerisch Gmain (DE)

(73) Assignee: fm marketing gmbh, Neumarkt am Wallersee (AT)

( * ) Notice: Subject to any disclaimer, the term of this patent is extended or adjusted under 35 U.S.C. 154(b) by 0 days.

(21) Appl. No.: 15/641,635

(22) Filed: Jul. 5, 2017

(65) Prior Publication Data

US 2018/0011509 A1 Jan. 11, 2018

(30) Foreign Application Priority Data

Jul. 5, 2016 (DE) .......................... 10 2016 112 318

(51) Int. Cl.
| | |
|---|---|
| *G05G 5/05* | (2006.01) |
| *G05G 1/02* | (2006.01) |
| *G05G 9/02* | (2006.01) |
| *G06F 3/033* | (2013.01) |
| *G08C 17/00* | (2006.01) |
| *H03K 17/97* | (2006.01) |
| *H04Q 9/00* | (2006.01) |
| *G05G 9/047* | (2006.01) |
| *G08C 17/02* | (2006.01) |

(52) U.S. Cl.
CPC .............. *G05G 5/05* (2013.01); *G05G 9/02* (2013.01); *G05G 9/047* (2013.01); *G06F 3/033* (2013.01); *G08C 17/00* (2013.01); *G08C 17/02* (2013.01); *H03K 17/97* (2013.01); *H04Q 9/00* (2013.01); *G05G 2009/04703* (2013.01)

(58) Field of Classification Search
CPC ....................................................... G05G 5/05
USPC ........................................................ 348/734
See application file for complete search history.

(56) References Cited

U.S. PATENT DOCUMENTS

| | | | |
|---|---|---|---|
| 5,579,002 A | 11/1996 | Iggulden et al. | |
| 8,643,480 B2 | 2/2014 | Maier et al. | |
| 8,695,797 B2 | 4/2014 | Maier | |
| 2004/0233159 A1* | 11/2004 | Badarneh | G06F 3/016 345/156 |
| 2008/0073993 A1* | 3/2008 | Sortore | F16C 32/0459 310/90.5 |
| 2010/0265176 A1 | 10/2010 | Olsson et al. | |
| 2013/0063339 A1 | 3/2013 | Maier | |

FOREIGN PATENT DOCUMENTS

| | | |
|---|---|---|
| DE | 2516171 A1 | 10/1976 |
| DE | 102010019596 A4 | 11/2011 |
| DE | 102015119485 A1 | 5/2017 |

* cited by examiner

*Primary Examiner* — Jefferey F Harold
*Assistant Examiner* — Justin B Sanders
(74) *Attorney, Agent, or Firm* — Stinson Leonard Street LLP

(57) ABSTRACT

A remote control having at least one multifunction button, to which force is applied in one direction by magnets and counter-magnets or mechanical springs, and to which journals with thickened heads are attached, wherein the thickened heads through interaction with bearing shells of a supporting plate serve as centering, guide, and movement stop of the multifunction button.

17 Claims, 4 Drawing Sheets

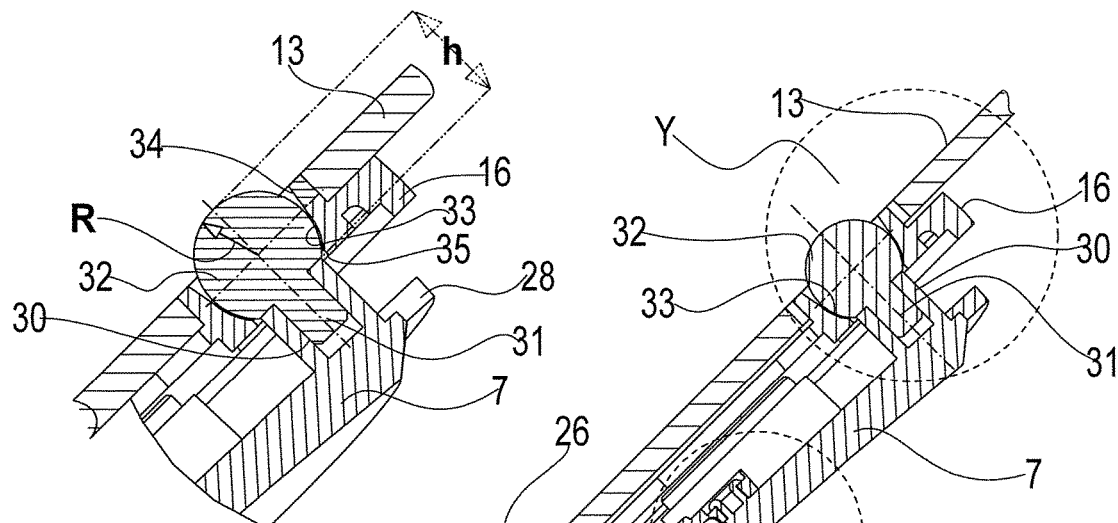
Fig. 6
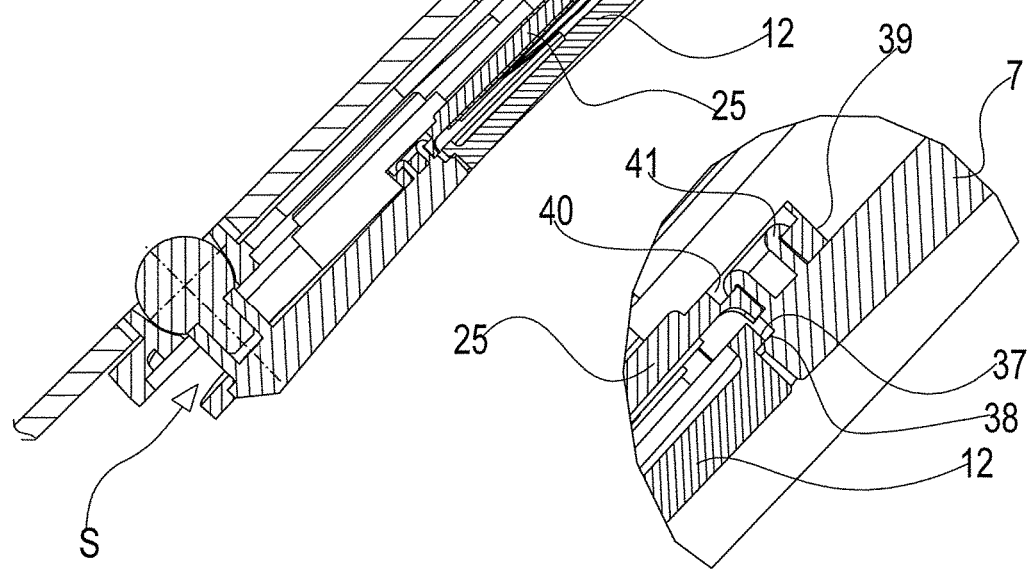
Fig. 5
Fig. 7

REMOTE CONTROL

REFERENCE TO RELATED APPLICATION

This application claims priority to German application 10 2016 112 318.8 filed Jul. 5, 2016, the entire disclosure of which is expressly incorporated herein by reference.

FIELD OF THE INVENTION

The invention relates to a remote control.

BACKGROUND

Remote controls, in which magnets with haptically perceptible forces are applied to input elements, such as buttons, are, for example known from DE 10 2011 014763 A1, DE 10 2010 019596 A1, EP 2568369 A1, or WO 2010/119348 A1.

In the older, unpublished DE 10 2015 119485, a remote control is described, which comprises a pushbutton that can be pressed by a user for inputting information in that the user applies a pressure in a direction, a sensor magnet arranged on the underside of the pushbutton, when viewed in the pressure application direction; and an armature magnet arranged below the pushbutton, when viewed in the pressure application direction, and fixed relative to the pushbutton, wherein the magnetic poles of the sensor magnet and of the armature magnet are arranged in such a way that the pushbutton is pressed by the sensor magnet away from the armature magnet, against the pressure application direction.

Document U.S. Pat. No. 5,579,002 discloses that a pushbutton field is held by means of locking hooks on a housing of a remote control. Document German patent publication 2516171 A1 discloses a button which is held by a guide and has a movement limitation stop in the guide.

SUMMARY OF THE INVENTION

With the present invention, a remote control is supposed to be created, in which at least one of the buttons is held, aligned, and guided with precision on the housing of the remote control. This is supposed to take place particularly to the greatest extent without play.

Briefly, therefore, the invention is directed to a remote control comprising a housing and a multifunction button which has a plurality of button areas which are arranged radially offset relative to a center and which are movable relative to the housing; wherein a plurality of journals with thickened head are fastened to the multifunction button; wherein a housing-stable supporting plate comprises bearing shells which are adjusted to the thickened heads; wherein the journals extend through openings of the supporting plate; and wherein the bearing shells and the thickened heads are configured as limitation stop for a movement of the multifunction button against a first direction.

Other advantages and features will be in part apparent and in part pointed out hereinafter.

BRIEF DESCRIPTION OF THE FIGURES

FIG. 5 shows a cross-section along the line A-A of FIG. 2.

FIG. 6 shows a magnified depiction of the detail Y of FIG. 5.

FIG. 7 shows a magnified depiction of the detail Z of FIG. 5.

DETAILED DESCRIPTION OF PREFERRED EMBODIMENTS

The basic idea of the invention is that of pressing a multifunction button with a plurality of button areas in a first direction toward the outer side of the housing. For mounting, guiding, centering, and aligning the multifunction button, a plurality of journals with a thickened head are attached to it, wherein a housing-stable supporting plate comprises bearing shells, and the thickened heads are adjusted to said bearing shells. The journals extend through the opening of the supporting plate, and the bearing shells in combination with the thickened heads are configured as guide and limitation stop for a movement of the multifunction button.

Preferably, the multifunction button comprises a plurality of button areas, which are arranged radially offset with regard to the center, said button areas having a plurality of magnets with counter-magnets, which are connected to the housing and associated with the magnets. The magnets and counter-magnets are polarized and arranged such that the multifunction button is pressed in a first direction toward the outer side of the housing.

Preferably, the multifunction button is configured as annulus. However, it can also be configured as a cross or a triangle.

The thickened heads are preferably shaped like a spherical segment. Preferably, the journals are attached in sleeves to the multifunction button, i.e. preferably glued to the multifunction button.

Furthermore, the magnets and journals are each arranged on the radially outer area of the multifunction button and each arranged at equidistant distances tangentially offset toward one another, wherein the magnets and journals themselves are also arranged offset toward one another.

According to a development of the invention, the supporting plate is attached to a conducting path board, wherein the conducting path board is held in the housing of the remote control.

Figure 1:
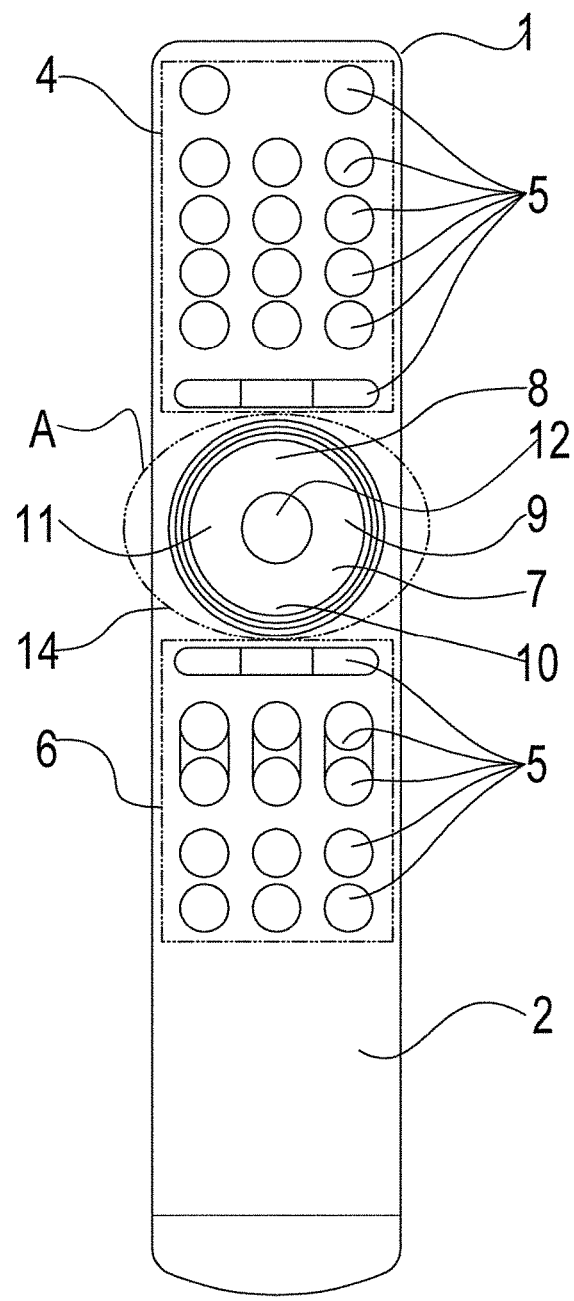
FIG. 1 shows a top view of a remote control according to the invention.

The remote control of FIG. 1 comprises a housing 1, which consists of a top cover 2 and a bottom cover 3, as well as a first button field 4, having a multiplicity of buttons 5, and a second button field 6, having a multiplicity of buttons 5, wherein for reasons of clarity, not all buttons in the button fields 4 and 6 are denoted with a reference sign.

Between the two button fields 4 and 6, a multifunction button 7 is arranged, in this case having four button areas 8, 9, 10, and 11, which, when being pressed down, through interaction with sensors or switches trigger specific signals, with which a multimedia device (not depicted), e.g. a television set, can be operated. It must be noted that the multifunction button can be pressed anywhere and not only at the aforementioned four button areas 8-11. As a result, a corresponding x,y-value is returned or also an r/phi-value in the polar coordinate system. This indicates in which direction and how deep the button was pressed. Here, the multifunction button 7 is depicted as annulus, wherein the button areas 8-11 are arranged radially with regard to the center of the annulus and tangentially at equidistant distances. The four button areas depicted herein are tangentially offset to one another by 90°. However, configurations with more than four button areas are possible, or also configurations with only three button areas.

Instead of an annulus, the multifunction button 7 can also be configured as directional pad having, for example, four arms. If one of the button areas 8-11 or any other point of the multifunction button is pressed down by the user, i.e. in the direction of the interior of the housing 1, this is detected and analyzed by sensors and electronics arranged in the interior of the housing.

In the depicted embodiment, in which the multifunction button 7 is configured as annulus, a circular actuation button 12 can be arranged inside the annulus.

In addition, display means, for example small lights, can be present on the remote control, with which a functional state of the remote control is displayed for a user of the remote control.

In the following, the invention is described in more detail using the area A of FIG. 1, in which the multifunction button 7 is arranged. However, this shall not be interpreted as delimiting because the following features can basically be transferred to any button 5 in the button fields 4 and 6.

Figure 2:
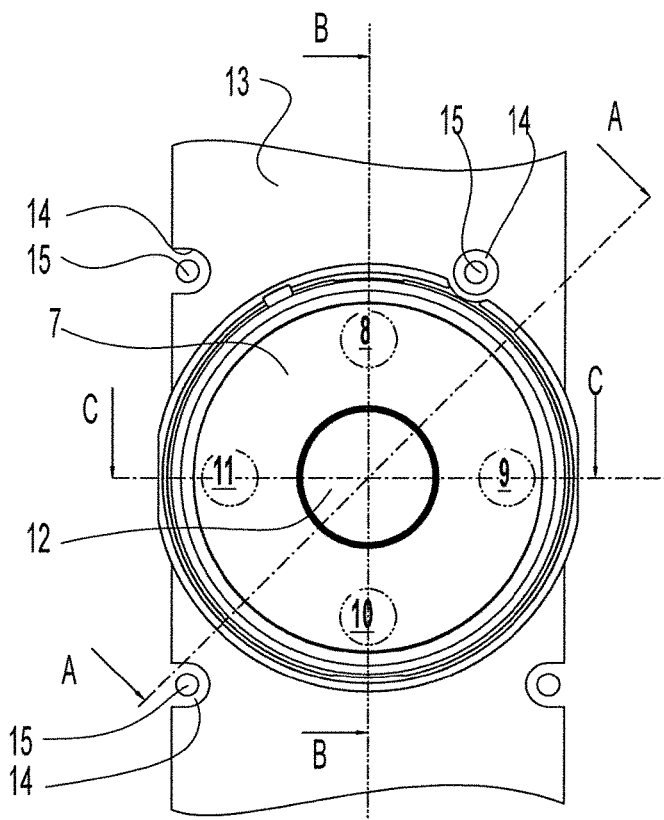
FIG. 2 shows a top view of a multifunction button of the remote control of FIG. 2 with removed top cover.

FIG. 2 shows a top view of the multifunction button 7, wherein the top cover 2 and the bottom cover 3 are removed. In this case, the multifunction button 7 is configured as annulus, in the center of which the circular actuation button 12 is arranged. As shall be described in more detail below, the multifunction button 7 is slidable relative to a conducting path board 13, arranged in a fixed manner in the housing 1, i.e. optionally with only one of the button areas 8-11 which can be moved into the interior of the housing 1 and is pressed outward by magnetic forces or spring forces, wherein a shift inward and outward is each delimited. If the user presses only one of the button areas 8-11, the multifunction button 7 is slightly tilted relative to the plane of the conducting path board 13, wherein the pressed button area is moved further inward into the housing 1 and thus comes closer to the conducting path board 13 than the button areas that were not pressed.

FIG. 2 also shows that the conducting path board 13 has a plurality of openings or recesses 14, through which journals 15 of the bottom cover 3 protrude and engage in sleeves in the top cover 2 in order to connect the top cover 2 and the bottom cover 3 with one another. This type of connection is described in more detail in EP 2620044 A1. Alternatively or additionally, the bottom cover 3 and the top cover 2 can also be glued, screwed or otherwise be permanently connected to one another.

The present invention mainly refers to the mounting of the multifunction button 7, which will be described in connection with the further FIGS. 3 to 9.

Generally, the multifunction button 7 together with the actuation button 12 is held on a supporting plate 16. The actuation button 12 is connected to the multifunction button 7 but for actuation can be moved to a limited extent relative to the multifunction button 7. The supporting plate 16 itself can be permanently connected to the conducting path board 13, for example, by means of gluing. However, the supporting plate 16 can also be immovably held relative to the conducting path board 13 in a different manner. The unit consisting of multifunction button 7 and actuation button 12 is slidable relative to the supporting plate 16, i.e. substantially perpendicularly to the plane of the conducting path board 13.

The supporting plate 16 has essentially the shape of an annulus (with recesses, FIG. 9), the diameter of which is somewhat larger than the diameter of the multifunction button 7, provided that it is designed as annulus. Other shapes of the multifunction button and the supporting plate are also possible.

On the multifunction button 7, a plurality of magnets 17 are attached which are arranged in circumferential direction at equidistant distances and are located near the outer circumference of the multifunction button 7. The magnets can be arranged near the button areas 8-11. However, other arrangements of the magnets are also possible. These magnets 17 are connected to the multifunction button 7 and fastened in sleeves 19 of the multifunction button 7. The magnets 17 are thus slidable together with the multifunction button 7.

Counter-magnets 18, which are associated with the magnets 17, are attached in sleeves 21 of the bottom cover 3 on the bottom cover 3 (FIG. 3) of the housing 1 of the remote control. Each counter-magnet 18 is associated with one of the magnets 17. The magnets 17 and the counter-magnets 18 are polarized and arranged such that one magnet 17 and one counter-magnet 18 repel one another, thus applying a magnetic force to the multifunction button 7 which presses the multifunction button 7 in the direction of the outer side of the top cover 2 of the housing 1. The respective pairs of magnet 17 and counter-magnet 18 are preferably arranged on the button areas 8-11 of the multifunction button 7.

At each of the areas of the magnets 17, the conducting path board 13 has an opening 22, through which the magnet 17 is moved closer to the counter-magnet 18, when an area of the multifunction buttons 7 is pressed down. Closely near each opening 22, a sensor 23 is arranged which detects the position of the magnets, e.g. by detecting the magnetic field lines of the magnets 17 and the counter-magnets 18 and forwarding them to evaluation electronics (not depicted) arranged on the conducting path board 13. The sensors 23 can, for example, be coils. It is obvious that the magnetic flux of the pairs of magnet 17 and counter-magnet 18 changes, when the button is pressed down, and so the signal detected by the sensor 23 allows for the detecting of the distance between magnet 17 and counter-magnet 18 as well as the speed, with which the multifunction button 7 is pressed down.

The conducting path board 13 is held at a distance from the bottom cover 3 by a multiplicity of ribs 29. The distance can be constant. However, a non-constant distance is also possible. The ribs 29 are molded integrally to the bottom cover 3 and also serve as stiffening of the lower part of the housing.

Figure 3:
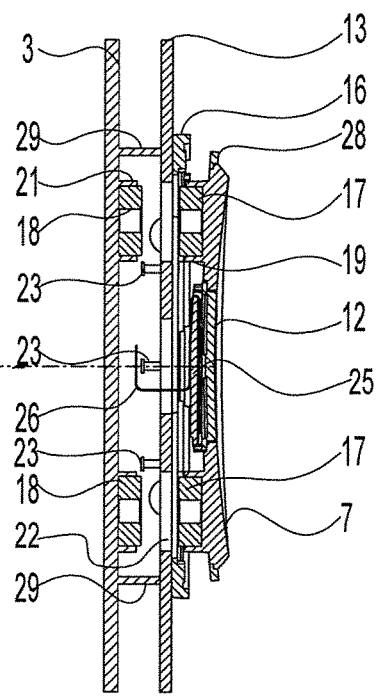
FIG. 3 shows a cross-section along the line B-B of FIG. 2.
Figure 4:
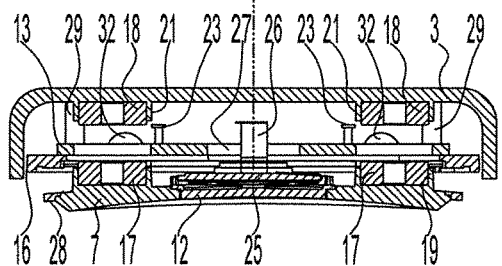
FIG. 4 shows a cross-section along the line C-C of FIG. 2.

FIGS. 3 and 4 also show that the actuation button 12 is designed as a switch having a lower shell 25 which is attached to the multifunction button 7, and so the actuation button 12 can be moved relative to the multifunction button 7. An electrical connection 26 of the actuation button 12 is guided through an opening 27 of the conducting path board 13 and connected to electronic circuits on the conducting path board 13, which is not depicted further.

FIGS. 3 and 4 finally also show that a decorative or marking ring 28 is attached to the outer circumference of the multifunction button 7.

In the following, the fastening, centering, and mounting of the multifunction button 7 shall be described in more detail with reference to FIGS. 5-9.

For guiding, mounting, and aligning the multifunction button 7, a plurality of sleeves 30 are provided on the underside of the multifunction button 7 which faces the conducting path board 13, wherein journals 31 are inserted in said sleeves 30 and permanently connected to the sleeves 30, for example, by means of gluing. Each of the journals 31 has a thickened head 32 which preferably has the shape of a spherical segment. The height h of the spherical segment is greater than the radius r of the sphere. (cf. FIG. 6)

The supporting plate 16 has openings 35 which are associated with the journals 31, said openings 35 having bearing shells 33 which are formed on the side facing away from the multifunction button 7, said bearing shells 33 being adjusted to the shape of the thickened head 32 and having an enlarging funnel-shaped opening 34.

If the multifunction button 7 is pressed away from the conducting path board 13 by the magnetic forces, the heads 32 and the bearing shells 33 act as limitation stop and simultaneously as centering for the alignment of the multifunction button 7. In the opposite direction, i.e. when pressed down by a user, the movement of the multifunction button 7 in the direction toward the conducting path board 13 is delimited by the underside of the multifunction button 7 bumping against the supporting plate 16. The possible travel of the multifunction button 7 is indicated in FIG. 5 by the gap S between the underside of the multifunction button 7 and the upper side of the supporting plate 16. When one of the button areas 8-11 is pressed down, the associated magnet 17 plunges into an associated opening 22 of the conducting path plate 13 and approaches the associated counter-magnet 18. This changes the magnetic field of the magnet 17 and the counter-magnet 18 which is detected by the associated sensors 23. The sensors, for example, can be coils which are attached to the side of the conducting path plate 13 that faces the bottom cover 3, i.e. as close as possible to the opening 22.

As is shown particularly clearly in FIG. 6, the bearing shell 33 has a circular opening 35 on the side facing the multifunction button 7, said opening 35 having a diameter that is greater than the outer diameter of the sleeve 30, thus also allowing for a "tilting" of the multifunction button 7 which occurs when one of the button areas 8-11 is pressed down while the other button areas are continued to be pressed "outward" by the magnetic forces, i.e. away from the conducting path board 13.

As is shown particularly clearly in FIG. 7, the actuation button 12 configured as switch comprises a radially protruding step 37 which is supported by a step 38 of the multifunction button 7 which is adjusted to the step 37, and so a sliding of the actuation button 38 "outward" beyond the stop formed by the step 37 is not possible. The lower shell 25 of the actuation button radially covers the actuation button 12 and comprises a plurality of arms 39 with bores 40, through which caulking journals 41 are inserted and caulked on the upper side of the arms 39, wherein these caulking journals 41 are integrally connected to the multifunction button 7 and protrude perpendicularly from the multifunction button 7. With the caulking of the caulking journals 41, the lower shell 25 is thus securely connected to the multifunction button 7. Between the actuation button 12 and the lower shell 25, switching contacts are arranged in a known manner and connected to the electrical connection 26.

Figure 8:
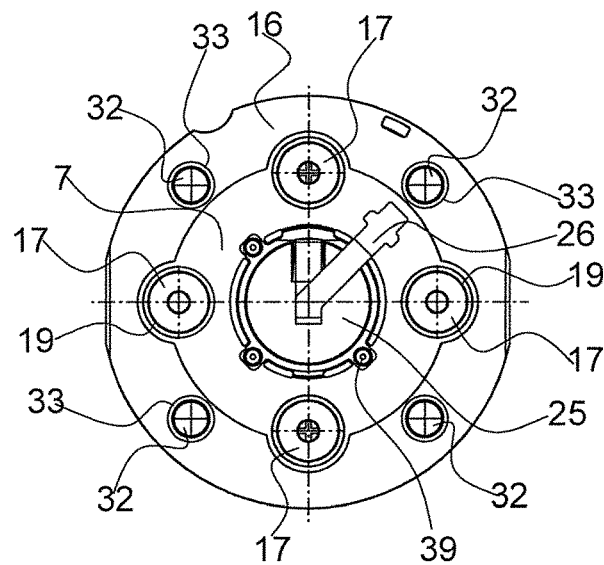
FIG. 8 shows a view of the underside of the multifunction button of FIG. 2.

FIG. 8 shows a top view of the underside of multifunction button 7, supporting plate 16, and actuation button 12. Shown are the magnets 17, which are attached to the multifunction button 7 and held in the sleeves 19, as well as the thickened heads 32 which are supported by the bearing shells 33 of the supporting plate 16. Also shown are the lower shell 25 of the actuation button 12 as well as the arms 39 and the caulking journals 41.

Figure 9:
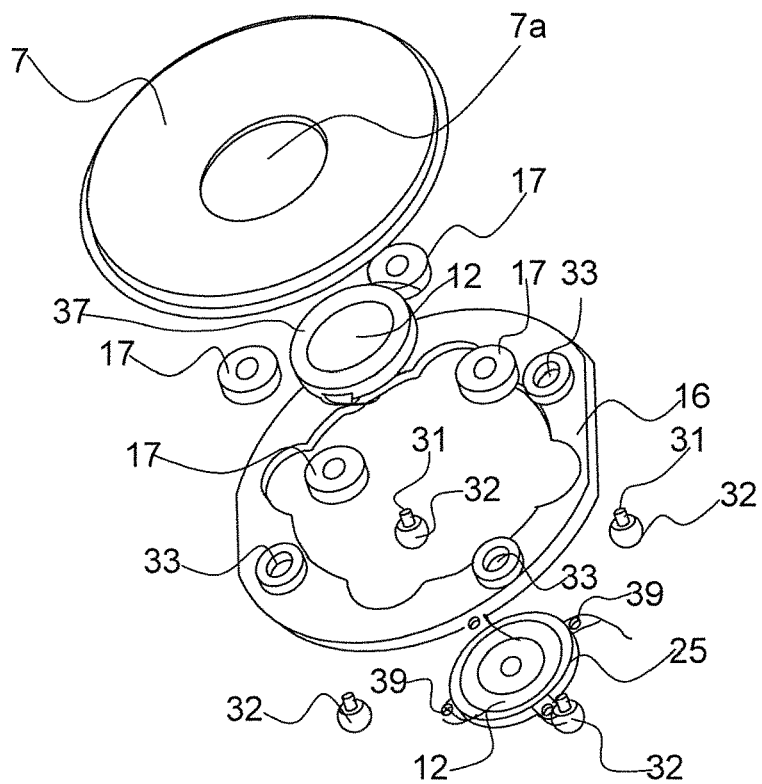
FIG. 9 shows an exploded view of the multifunction button.

FIG. 9 illustrates the assembly of the multifunction button. At first, the magnets 17 are attached to the underside of the multifunction button 7 in the sleeves (19, FIG. 8), and the actuation button 12 with its radially protruding edge 37 is inserted in the centered opening 7a of the multifunction button 7. The lower shell 25 is subsequently added, wherein the arms 39 are positioned at the caulking journals 41 at the underside of the multifunction button 7 and caulked. Then, the journals 31 with the thickened heads 32 are inserted through the bearing shells 33 and connected to the associated sleeves 19 at the underside of the multifunction button 7, thus simultaneously connecting the supporting plate 16 with the multifunction button 7. The correct position and particularly the distance between the multifunction button 7 and the circuit board 13 is determined by the dimensioning of the sleeves 30, the thickened heads 32, and the bearing shells 33.

The thus assembled multifunction button is subsequently fastened in place relative to the conducting path board 13, e.g. by gluing the supporting plate 16 to the conducting path board 13.

Here is a convenient list of the components and reference numbers discussed above:

1 Housing
2 Top cover
3 Bottom cover
4 first button field
5 Buttons
6 second button field
7 Multifunction button
8,9,10,11 Button areas
12 Actuation button
13 Conducting path board
14 Openings
15 Journals (connection 2 and 3)
16 Supporting plate
17 Magnets
18 Counter-magnets
19 Sleeves (for 17)
21 Sleeves (for 18)
22 Opening (for 17)
23 Sensor
24 Pins (13 on 3)
25 Lower shell (of 12)
26 electrical connection (of 12)
27 Opening (in 13 for 26)
28 Marking ring
29 Ribs
30 Sleeves for journals
31 Journal
32 Head
33 Bearing shells
34 funnel-shaped opening
35 Opening for journal
37 Step (on 12)
38 Upper side (of 39)
39 Arms (on 25)
40 Bore (at 39)
41 Caulking journal
S Gap
R Radius (of 32)
h Height (of 32)

When introducing elements of the present invention or the preferred embodiments(s) thereof, the articles "a", "an",

The invention claimed is:

1. A remote control comprising a housing and a multifunction button which has a plurality of button areas which are arranged radially offset relative to a center and which are movable relative to the housing;
    wherein a plurality of journals with thickened head are fastened to the multifunction button;
    wherein a housing-stable supporting plate comprises bearing shells which are adapted for receiving the thickened heads;
    wherein the journals extend through openings of the supporting plate;
    wherein the thickened heads protrude above a flat surface of the supporting plate in a direction away from the multifunction button;
    and wherein the bearing shells and the thickened heads are configured as limitation stop for a movement of the multifunction button against a first direction.

2. Remote control according to claim 1, characterized in that the multifunction button comprises a plurality of button areas which are arranged radially offset relative to their center and having a plurality of magnets and counter-magnets, which are connected to the housing and associated with the magnets, wherein magnets and counter-magnets are polarized and arranged such that the multifunction button is pressed away in the first direction toward the outer side of the housing.

3. Remote control according to claim 1, characterized in that the multifunction button has the shape of an annulus.

4. Remote control according to claim 2, characterized in that the multifunction button has the shape of an annulus.

5. Remote control according to claim 1, characterized in that the multifunction button has the shape of a cross.

6. Remote control according to claim 2, characterized in that the multifunction button has the shape of a cross.

7. Remote control according to claim 1,
    wherein the plurality of journals with thickened head fastened to the multifunction button have thickened sphere heads;
    wherein the housing-stable supporting plate comprises bearing shells are adapted for receiving the sphere heads;
    wherein the journals extend through openings of the supporting plate;
    and wherein the bearing shells and the thickened sphere heads are configured as limitation stop for a movement of the multifunction button against a first direction.

8. Remote control according to claim 1, characterized in that the journals are fastened in sleeves of the multifunction button.

9. Remote control according to claim 1, characterized in that four magnets and four journals with thickened head are arranged on the multifunction button, wherein the magnets and the journals are tangentially offset to one another.

10. Remote control according to claim 1, characterized in that the supporting plate is fastened to the housing upper side or the housing underside or to a conducting path board.

11. Remote control according to claim 2,
    wherein the plurality of journals with thickened head fastened to the multifunction button have thickened sphere heads;
    wherein the housing-stable supporting plate comprises bearing shells are adapted for receiving the sphere heads;
    wherein the journals extend through openings of the supporting plate;
    and wherein the bearing shells and the thickened sphere heads are configured as limitation stop for a movement of the multifunction button against a first direction.

12. Remote control according to claim 2, characterized in that the journals are fastened in sleeves of the multifunction button.

13. Remote control according to claim 11, characterized in that four magnets and four journals with thickened sphere head are arranged on the multifunction button, wherein the magnets and the journals are tangentially offset to one another.

14. Remote control according to claim 2, characterized in that the supporting plate is fastened to the housing upper side or the housing underside or to a conducting path board.

15. Remote control according to claim 10, characterized in that the journals are fastened in sleeves of the multifunction button.

16. Remote control according to claim 10, characterized in that four magnets and four journals with thickened head are arranged on the multifunction button, wherein the magnets and the journals are tangentially offset to one another.

17. Remote control according to claim 10, characterized in that the supporting plate is fastened to the housing upper side or the housing underside or to a conducting path board.

* * * * *